(12) United States Patent
Kinanen

(10) Patent No.: US 6,683,456 B1
(45) Date of Patent: Jan. 27, 2004

(54) MRI MAGNET WITH REDUCED FRINGE FIELD

(75) Inventor: Ilmari Kinanen, Espoo (FI)

(73) Assignee: Koninklijke Philips Electronics, N.V., Eindhoven (NL)

( * ) Notice: Subject to any disclaimer, the term of this patent is extended or adjusted under 35 U.S.C. 154(b) by 480 days.

(21) Appl. No.: 09/611,118

(22) Filed: Jul. 6, 2000

(51) Int. Cl.$^7$ ................................................ G01V 3/00
(52) U.S. Cl. ...................................... 324/318; 324/319
(58) Field of Search ................................ 324/319, 320, 324/318, 300, 322; 335/216, 301

(56) References Cited

U.S. PATENT DOCUMENTS

| | | | |
|---|---|---|---|
| 4,584,549 A | * 4/1986 | Brown et al. .............. | 335/301 |
| 4,646,046 A | * 2/1987 | Vavrek et al. ............. | 335/301 |
| 5,128,643 A | 7/1992 | Newman .................... | 335/301 |
| 5,197,492 A | 3/1993 | Rawls, Jr. et al. ......... | 128/846 |
| 5,309,106 A | 5/1994 | Miyajima et al. .......... | 324/318 |
| 5,565,831 A | * 10/1996 | Dorri et al. ................ | 335/216 |
| 5,565,834 A | 10/1996 | Hanley et al. ............. | 335/296 |
| 5,883,558 A | 3/1999 | Laskaris et al. ........... | 335/216 |
| 6,023,165 A | 2/2000 | Damadian et al. ......... | 324/318 |

FOREIGN PATENT DOCUMENTS

| | | |
|---|---|---|
| JP | 07100125 | 4/1995 |
| JP | 11019061 | 1/1999 |

* cited by examiner

Primary Examiner—Louis Arana
(74) Attorney, Agent, or Firm—Fay, Sharpe, Fagan, Minnich & McKee, LLP

(57) ABSTRACT

An MRI scanner generates a temporally constant ($B_0$) magnetic field through an examination region (10), as well as a surrounding fringe field. The fringe field tends to decrease in strength with distance from the examination region and includes a 5 Gauss line (70, 70') and a 1 Gauss line (74). In a vertical field magnet, the 5 Gauss line can extend more than 3 or 4 meters above and below upper and lower pole assemblies (12, 14). By placing permanent magnets (70, 76) above and below the upper and lower pole assemblies, respectively, with an opposing magnetic polarity, the fringe field is shaped and controlled reducing a distance (d) of the 5 Gauss line above the scanner to about 2 meters and reducing an amount of ferrous material in a ferrous flux return path (24).

16 Claims, 3 Drawing Sheets

MRI MAGNET WITH REDUCED FRINGE FIELD

BACKGROUND OF THE INVENTION

The present invention relates to the diagnostic imaging arts. It finds particular application in controlling flux fields in conjunction with open MRI scanners and will be described with particular reference thereto. It will be appreciated, however, that the present invention is also applicable to bore and other types of magnetic systems with different flux return paths or no flux return paths.

In magnetic resonance imaging, a uniform magnetic field is created through an examination region in which a subject to be examined is disposed. With open magnetic systems, the main magnetic field is generated vertically between upper and lower pole pieces. A series of radio frequency (RF) pulses and magnetic field gradients are applied to the examination region to excite and manipulate magnetic resonances. Gradient magnetic fields are conventionally applied to encode spatial position and other information in the excited resonance. The magnetic resonance signals are then processed to generate two or three dimensional image representations of a portion of the subject in the examination region.

In an open system, the field does not only exist between the poles. There is also a flux return path through which the main magnetic field returns forming closed loops. Often, a ferrous flux return path provides a low resistance flux return path. With a ferrous flux return path, there is still a fringe magnetic field from flux that is returning through the air rather than the flux return path. For safety reasons, the examination room, and associated viewing and control rooms, are configured and shielded such that technicians are not subject to a field greater than 5 Gauss (500 $\mu$T). With conventional systems, the fringe fields have been reduced by increasing the cross section of the ferrous return path or ferrous sheathing in the walls. Depending on factors such as the size of the main magnetic field and the size of the room, the amount of ferrous shielding ranges from 10 to 200 tons of iron. Increasing the iron in the return path reduces distance from the examination region to the 5 Gauss line.

One direction in which control of the 5 Gauss line has proved elusive is in the vertical direction above and below the magnet assembly. In larger field magnets, the 5 Gauss line extends into the floor above the magnetic resonance suite (over 4 meters with a 0.5 T main field). The cost of the added iron and the structure to support it often limit installation sites to the ground floor with the floor above, if any, off limits for human occupancy.

In bore type systems, active shielding of the magnetic field reduces the fringe field. However, the active shielding technology is not particularly amenable with open systems. In bore systems, it is difficult to limit the 5 Gauss line along the axis of the bore.

The present invention provides a new and improved method and apparatus that overcomes the above referenced problems and others.

SUMMARY OF THE INVENTION

In accordance with the present invention, a magnetic resonance apparatus includes a first magnet assembly which generates a temporally constant main magnetic field through an examination region and generates a fringe field that extends peripherally outward from the main magnetic field. At least a second magnet assembly is disposed to reshape at least a portion of the fringe field. An RF transmitter transmits radio frequency pulses to an RF coil to excite resonance in selected dipoles. An RF coil assembly receives resonance signals from the resonating dipoles. A radio frequency receiver demodulates the resonance signals and a processor processes them.

In accordance with a more limited aspect of the present invention, the second magnet assembly includes permanent magnet material.

In accordance with another aspect of the present invention, an improvement is provided in a magnetic resonance apparatus which generates a temporally constant magnetic field through an examination region and which generates a fringe field beyond the examination region. The improvement includes permanent magnets positioned to move at least portions of the fringe field closer to the examination region.

In accordance with another aspect of the present invention, a magnetic method is provided. A main magnetic field is generated through a region of interest and a fringe field is concurrently generated around the region of interest. Permanent magnets are positioned to shape and contain the fringe field.

One advantage of the present invention is that it reduces the amount of shielding needed to contain the fringe magnetic field.

Another advantage of the present invention is that it allows for open MR systems with smaller, if any, ferrous flux return paths.

Another advantage of the present invention is that it allows for a less massive MR unit that is not restricted by weight to the ground floor of buildings.

Another advantage of the present invention is that it allows for MR system integration into existing buildings rather than constructing rooms specifically designed for them.

Yet another advantage of the present invention is that it can be used with C-shaped magnets, H-shaped magnets, four-poster magnets, open systems and permanent magnets.

Still further benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENT

Figure 1:
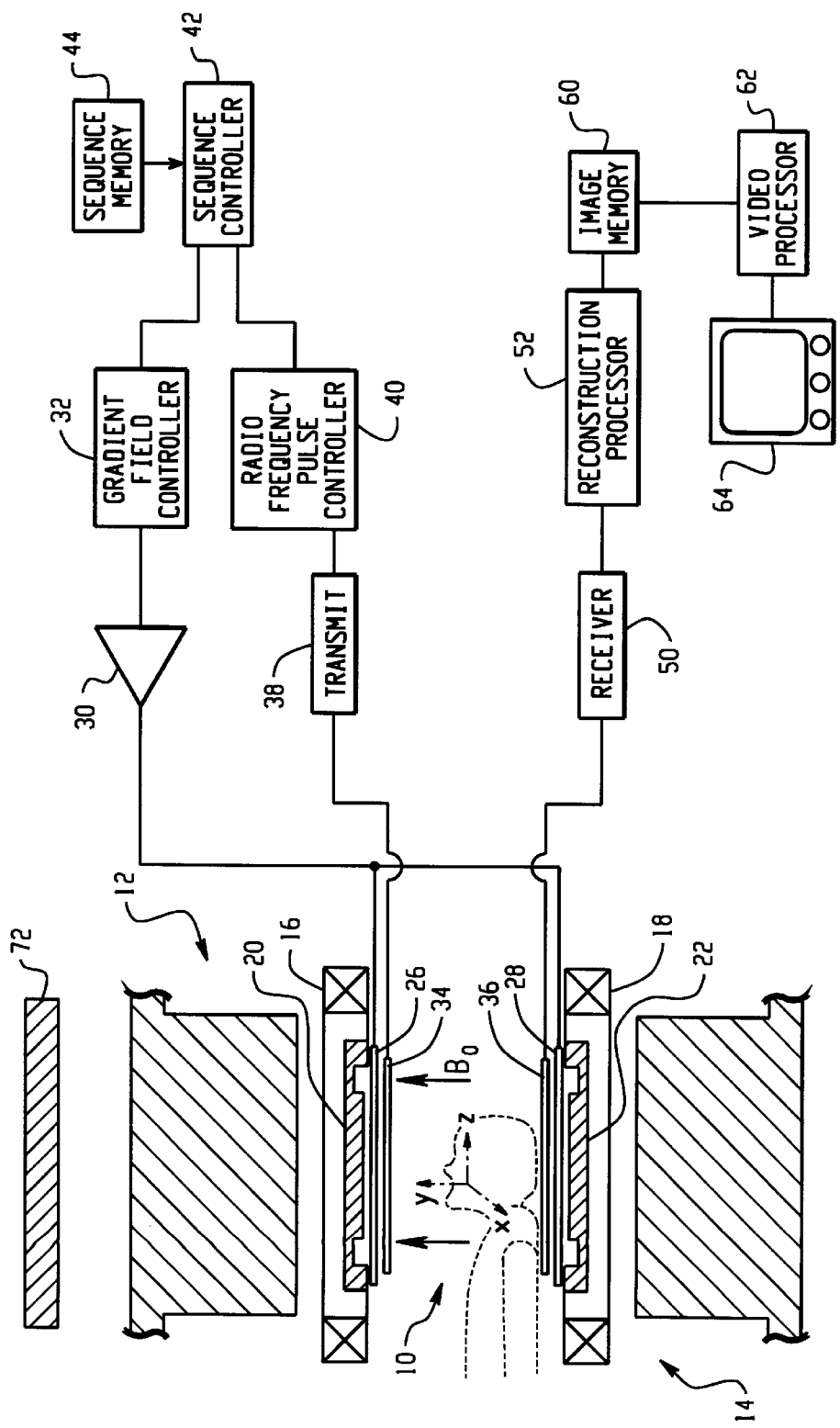
FIG. 1 is a diagrammatic illustration of a magnetic resonance imaging system in accordance with the present invention.

With reference to FIG. 1, in an open MRI system an imaging region 10 is defined between an upper pole assembly 12 and a lower pole assembly 14. A pair of annular super-conducting magnets 16, 18 surround upper and lower pole pieces 20, 22 generating a temporally constant, main magnetic field $B_0$ through the imaging region 10. It is to be appreciated that the open MRI system may have a variety of pole pieces or, in some instances, no pole pieces at all. Optionally, a ferrous flux return path 24 is provided between the pole assemblies 12,14 remote from the imaging region 10. Alternately, superconducting or resistive windings can be positioned at other locations adjacent the imaging region or along the flux return path. Permanent magnets are also contemplated.

For imaging, magnetic field gradient coils 26, 28 are disposed on opposite sides of the imaging region 10 adjacent the pole pieces 20, 22. In the preferred embodiment, the gradient coils are planar coil constructions which are connected by gradient amplifiers 30 to a gradient magnetic field controller 32. The gradient magnetic field controller 32 causes current pulses which are applied to the gradient coils such that gradient magnetic fields are superimposed on the temporally constant and uniform field $B_0$ across the imaging region 10. The gradient fields are typically generated along a longitudinal or z-axis, a vertical or y-axis and a transverse or x-axis.

In order to excite magnetic resonance in selected dipoles of a subject disposed in the imaging region 10, radio frequency coils 34, 36 are disposed between the gradient coils 26, 28 and the imaging region 10. At least one radio frequency transmitter 38, preferably a digital transmitter, causes the radio frequency coils to transmit radio frequency pulses requested by a radio frequency pulse controller 40 to be transmitted into the imaging region 10. A sequence controller 42, under operator control, retrieves an imaging sequence from a sequence memory 44. The sequence controller 42 provides the selected sequence information to the gradient controller 32 and the radio frequency pulse controller 40 such that radio frequency and gradient magnetic field pulses in accordance with the selected sequence are generated. Typically, the radio frequency coils 34, 36 are general purpose coils and are operable in both transmit and receive modes. Alternately, surface or local coils are provided.

Magnetic resonance signals picked up by the radio frequency coils 34, 36 are demodulated by one or more receivers 50, preferably digital receivers. The digitized signals are processed by a reconstruction processor 52 into volumetric or other image representations which are stored in a volumetric image memory 60. A video processor 62, under operator control, withdraws selected image data from the volume memory and formats it into appropriate data for display on a human readable display 64, such as a video monitor, active matrix monitor, liquid crystal display, or the like.

Figure 2:
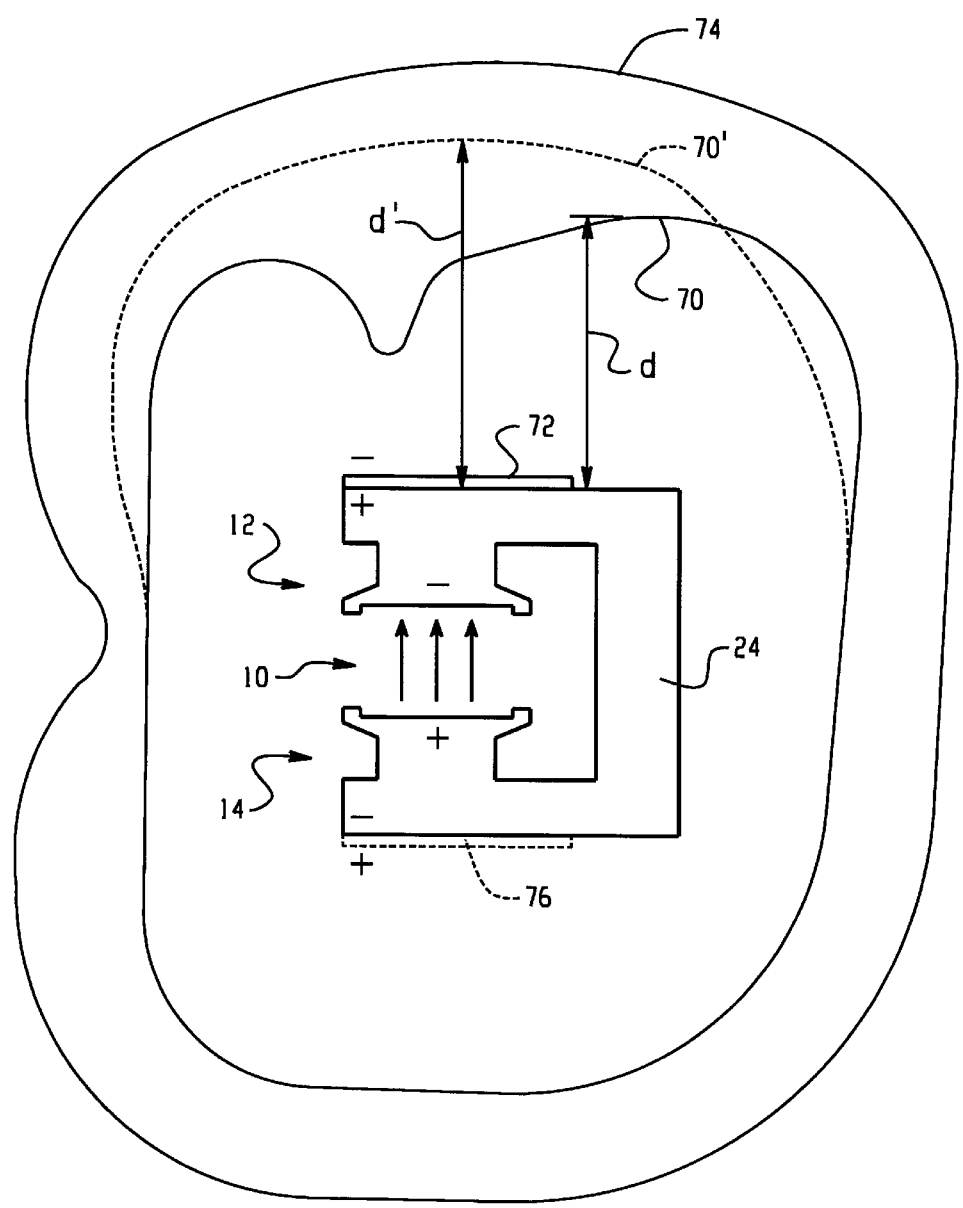
FIG. 2 is a diagrammatic illustration of a magnetic resonance imaging system in accordance with aspects of the present invention showing an associated fringe field.

With reference to FIG. 2, the open MRI system is surrounded by a fringe magnetic field. Although most of the return flux passes through the ferrous flux return path 24, a portion of the flux returns through the air, creating a surrounding fringe magnetic field which becomes weaker with distance. A 5 Gauss fringe field line 70', for example, extends above the MRI scanner by a distance a d'. In an embodiment in which the main magnetic field is 0.6 T, and the flux return path 24 includes 30 metric tons of ferrous material, the distance d' is about 4.25 meters. As the amount of ferrous material in the flux return path is increased to 33 metric tons, the distance d' decreases to about 3.7 meters. When the amount of ferrous material is increased to 35 metric tons, the distance d' decreases to about 3.65 meters.

Thus, significantly more steel is needed for progressively smaller improvements. Analogously, as the main field increases in strength, the distance d' increases and the amount of ferrous material increases; at 4 T, a ferrous flux return path of 100–200 metric tons of iron is typical.

A strong, opposing magnetic field is generated above the upper pole piece 12, preferably by a permanent magnet 72. The permanent magnet reduces the location of the 5 Gauss line 70 to a reduced height d. In the preferred embodiment, the magnet 72 is an 8 mm thick matrix of neodymium ferrous boron (NdFeB) permanent magnet which reduces the distance d to about 2.2 meters. The height of a 1 Gauss line 74 above the MRI scanner is also reduced. Preferably, the magnet is constructed in relatively small plates or tiles of about 5 cm×5 cm. Thicker tiles can be spaced further and thinner magnet tiles can be spaced closer or layered.

The reduction in the distance to the 5 Gauss line enables the amount of ferrous material in the ferrous flux return path 24 to be reduced. This reduces the weight of the MRI scanner sufficiently that it is a candidate for placement above the ground floor. When the location of the 5 Gauss line below the scanner is of concern, an additional permanent magnet 76 is mounted below the lower pole assembly with opposite polarity to the lower pole assembly.

Figure 3:
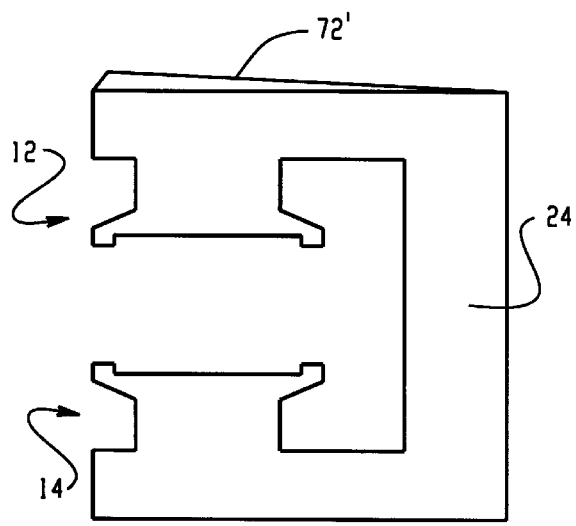
FIG. 3 is a diagrammatic illustration of an MRI scanner with an alternate permanent magnet placement.
Figure 4:
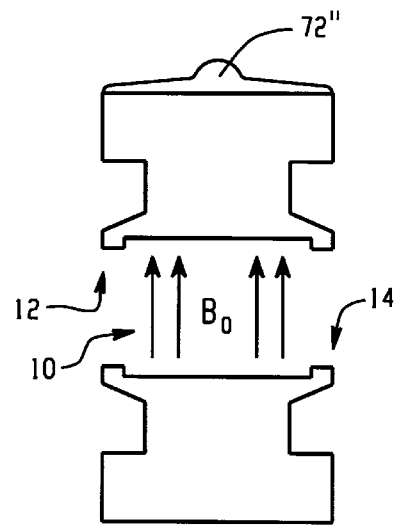
FIG. 4 is a diagrammatic illustration of another alternate embodiment.

With reference to FIG. 3, in an alternate embodiment, the permanent magnet is contoured in shape to lower the 5 Gauss line more uniformly or with another controlled profile. In the illustrated embodiment, the magnet 72' is tapered. In the embodiment of FIG. 4, the permanent magnet 72" is smoothly contoured to apply a maximum thickness, hence opposing field, over the geometric center of the upper pole piece. The contoured shapes will vary with the nature of the ferrous flux return path, e.g., C-magnet, H-magnet, four-poster, ferrous walls, or the like as well as field strength. Analogously, shaped magnets can be positioned below the lower piece where applicable.

Figure 5:
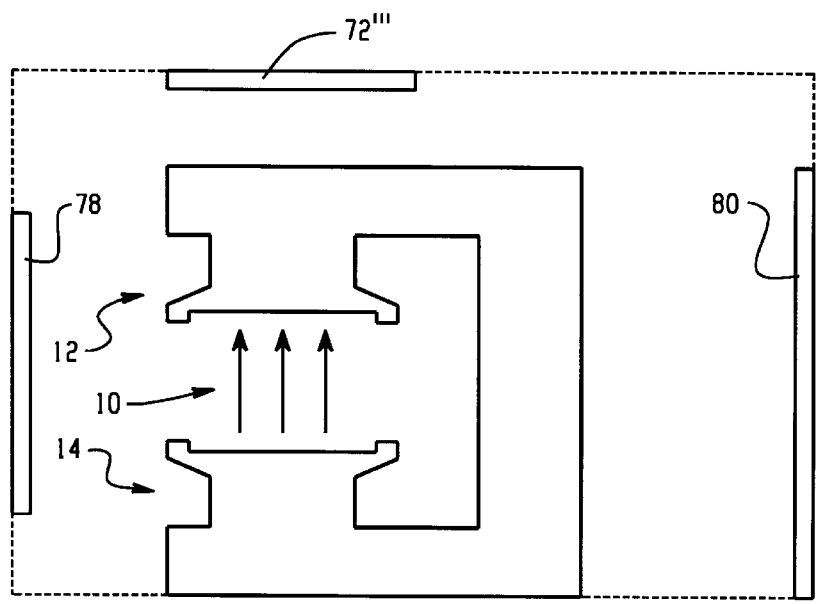
FIG. 5 is a diagrammatic illustration of yet another alternate embodiment.

With reference to FIG. 5, the permanent magnet is alternately connected displaced above or below the pole assemblies to an associated structure. Separating the permanent magnet from the pole assembly and the ferrous flux return path eliminates coupling between the permanent magnet and the ferrous flux return path. When the permanent magnet is positioned closer to the iron, the fields couple, but the effect on the fringe magnetic field is stronger. of course, the structure of the pole pieces can be designed in coordination with the permanent magnets to create offsetting distortions, i.e., to make the main magnetic field more linear in the presence of the permanent magnets.

Permanent magnets can also be positioned at other locations around the MRI scanner. For example, when lateral containment of the 5 Gauss line is important, permanent magnets 78, 80 are placed vertically adjacent the scanner. These permanent magnets can be attached to convenient physical structures, such as the walls of the examination suite. Again, placing the magnets more remotely from the examination region 10 minimizes their effect on the main magnetic field.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. An open magnetic resonance apparatus comprising:
   a first magnet assembly which generates a temporally constant main magnetic field through an examination region between first and second poles and a fringe field that extends peripherally outward from the main magnetic field on opposite sides of the poles from the main magnetic field;
   a permanent magnet assembly disposed on the opposite side of one of the poles from the main magnetic field to reshape at least a portion of the fringe field by compressing flux lines on the opposite side of the one pole closer to the one pole;
   an RF transmitter which transmits radio frequency pulses to an RF coil assembly to excite resonance in selected dipoles in the examination region, such that the dipoles generate resonance signals;
   an RF coil assembly which receives resonance signals from the resonating dipoles;
   at least one radio frequency receiver for demodulating the resonance signals received from the RF coil assembly; and,
   a processor for processing the demodulated resonance signals.

2. The magnetic resonance apparatus as set forth in claim 1 wherein the permanent magnet assembly is placed above the first magnet assembly such that it produces an opposite magnetic field.

3. The magnetic resonance apparatus as set forth in claim 1 wherein the permanent magnet assembly includes a sheet of permanent magnet material.

4. A magnetic resonance apparatus comprising:
   a first magnet assembly which generates a temporally constant main magnetic field through an examination region and a fringe field that extends peripherally outward from the main magnetic field, the first magnet assembly including:
      two pole assemblies disposed on opposite sides of the examination region, and
      a ferrous flux return path connecting the pole assemblies remote from the examination region;
   at least a second magnet assembly disposed to reshape at least a portion of the fringe field, the second magnet assembly being disposed adjacent at least one of the ferrous flux return path and the pole assemblies;
   an RF transmitter which transmits radio frequency pulses to an RF coil assembly to excite resonance in selected dipoles in the examination region, such that the dipoles generate resonance signals;
   an RF coil assembly which receives resonance signals from the resonating dipoles;
   at least one radio frequency receiver for demodulating the resonance signals received from the RF coil assembly; and,
   a processor for processing the demodulated resonance signals.

5. The magnetic resonance apparatus as set forth in claim 4 wherein the second magnet assembly is disposed above an upper of the pole pieces.

6. The magnetic resonance apparatus as set forth in claim 5 wherein a third magnet assembly is disposed below a lower of the pole pieces.

7. A magnetic resonance apparatus comprising:
   a first magnet assembly including a pole assembly disposed above an examination region to generate a temporally constant vertical main magnetic field through an examination region and a fringe field that extends peripherally outward around the main magnetic field;
   a second magnet assembly placed above the pole assembly to reshape at least a portion of the fringe field;
   an RF transmitter which transmits radio frequency pulses to an RF coil assembly to excite resonance in selected dipoles in the examination region, such that the dipoles generate resonance signals;
   an RF coil assembly which receives resonance signals from the resonating dipoles;
   at least one radio frequency receiver for demodulating the resonance signals received from the RF coil assembly; and,
   a processor for processing the demodulated resonance signals.

8. The magnetic resonance apparatus as set forth in claim 7 wherein the second magnet assembly includes permanent magnet material.

9. The magnetic resonance apparatus as set forth in claim 8 wherein the permanent magnet material is contoured.

10. The magnetic resonance apparatus as set forth in claim 7 wherein the second magnet assembly includes a permanent magnet which is mounted displaced from the upper pole assembly with an opposing polarity.

11. In a magnetic resonance apparatus which has at least one pole and generates a temporally constant main magnetic field through an examination region and which generates a fringe field beyond a side of the pole opposite to the examination region, the improvement comprising:
   permanent magnets positioned with portions of the permanent magnets with a polarity like a polarity of the pole disposed away from the pole and portions of the permanent magnets with a polarity opposite to the polarity of the pole facing toward the pole to move at least portions of the fringe field closer to the examination region.

12. A magnetic method comprising:
   generating a main magnetic field between the pole pieces through a region of interest and concurrently generating a fringe field around the pole pieces and the region of interest;
   positioning permanent magnets adjacent at least one of the pole pieces to shape and contain the fringe field adjacent the at least one pole piece.

13. The method as set forth in claim 12 further including:
   exciting magnetic resonance in selected dipoles in the region of interest;
   receiving magnetic resonance signals from the resonating dipoles;
   reconstructing the received magnetic resonance into an image representation.

14. The method as set forth in claim 12 wherein the main magnetic field is generated vertically and wherein the positioning step includes:
   positioning the permanent magnet above an upper one of the pole pieces and the examination region.

15. The method as set forth in claim 14 further including:
   placing permanent magnets below the region of interest.

16. The method as set forth in claim 12 wherein magnetic flux from one side of the region of interest is returned to an opposite side through a ferrous flux return path, the method further including:
   placing permanent magnets at least partially along the ferrous flux return path.

* * * * *